April 21, 1959 J. R. CUSHMAN 2,883,445

COOLING SYSTEM AND MOUNTING FOR UNITIZED SEALED ELECTRONIC ASSEMBLIES

Filed July 17, 1956 2 Sheets-Sheet 1

INVENTOR.
JOHN R. CUSHMAN
BY Wade Koontz and
Lloyd B. Stevens, Jr.
ATTORNEYS

April 21, 1959 J. R. CUSHMAN 2,883,445

COOLING SYSTEM AND MOUNTING FOR UNITIZED SEALED ELECTRONIC ASSEMBLIES

Filed July 17, 1956 2 Sheets-Sheet 2

INVENTOR.
JOHN R. CUSHMAN
BY Wade Koontz and
Lloyd B. Stevens, Jr.
ATTORNEYS

United States Patent Office 2,883,445
Patented Apr. 21, 1959

2,883,445

COOLING SYSTEM AND MOUNTING FOR UNITIZED SEALED ELECTRONIC ASSEMBLIES

John R. Cushman, Fort Wayne, Ind., assignor to the United States of America as represented by the Secretary of the Air Force Application July 17, 1956, Serial No. 598,488

1 Claim. (Cl. 174—15)

This disclosure relates generally to the cooling of unitized electronic assemblies and in particular to a mounting unit therefor having improved heat transfer characteristics.

The advances made in recent years from subsonic to supersonic flight have necessarily resulted in considerable changes of a structural nature in aircraft. One of the common results of these changes has been the reduction of space available for the installation of electronic equipment. Concurrently therewith, another result has been the need to install additional electronic equipment over that utilized in the past. The reduction in available space for electronic equipment installation, coupled with the need for the additional electronic equipment has led to the widespread use of unitized sealed assemblies incorporating miniature and subminiature electrical circuit components.

Such compacting of the electronic equipment has resulted in increased temperature control problems since the heat density of the electrical circuit components is, in general, inversely proportional to their size, and the use of sealed unitized assemblies has prevented the use of conventional cooling methods. As such, the trend towards more compact units in sealed unitized assembly form has made it imperative to provide adequate cooling of the electronic components in order to maintain satisfactory component life and reliability.

Because of the rather rigid design requirements necessitating the utilization of unitized sealed assemblies of relatively small size, conduction offers the principal mode by which the heat generated within the units can be conveyed to a suitable heat sink and thereby control the temperature rise of the unitized assemblies and the electronic components contained therein. The heat sink in the particular heat exchanger described herein is of the well known cold plate type.

The use of the cold plate type of heat exchanger has decided advantages over other proposed methods in that the heat transferred to the cold plate is isolated from the cabin, and as such helps reduction in the cooling load of the cabin cooling system. In addition it requires little power and makes effective use of the cooling air as well as being relatively small in both weight and bulk. The cold plate system also allows for easy accessibility to the electronic containers without jeopardy to cabin pressurization since it is an entirely sealed system.

Certain design specification fix to a large extent the size and configuration of the cold plate for the heat exchanger system disclosed herein. To achieve an economy of volume, the unitized assemblies such as the amplifier containers are located across the entire width of the top and bottom surfaces of the cold plate, and the introduction and removal of the cooling air is effected at the rear of the cold plate, thus permitting ready removal of the sealed assemblies from the front of the unit.

The primary object of this disclosure is to provide a compact and efficient heat exchanger of the cold plate type incorporating facilities for the ready removal and insertion of the unitized sealed assemblies.

Other objects and advantages of the structure disclosed herein will be set forth in the following portions of this disclosure and in the accompanying drawings which illustrate, by way of example, the presently preferred structure incorporating the principles set forth herein.

Referring to the drawings.

Figure 1:
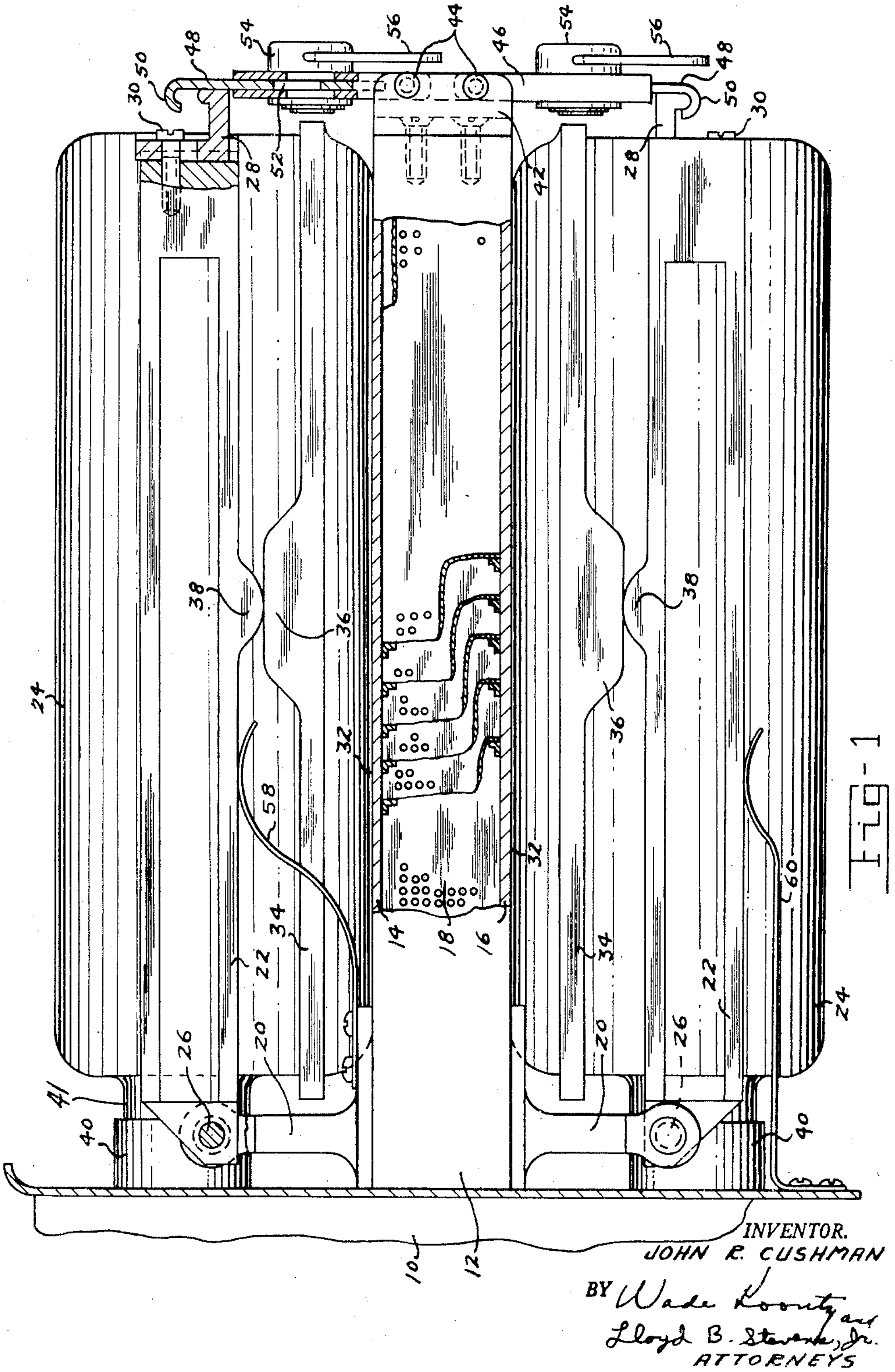
Fig. 1 is a side elevational view, partially in section, of the heat exchanger unit and mounting members thereof.
Figure 2:
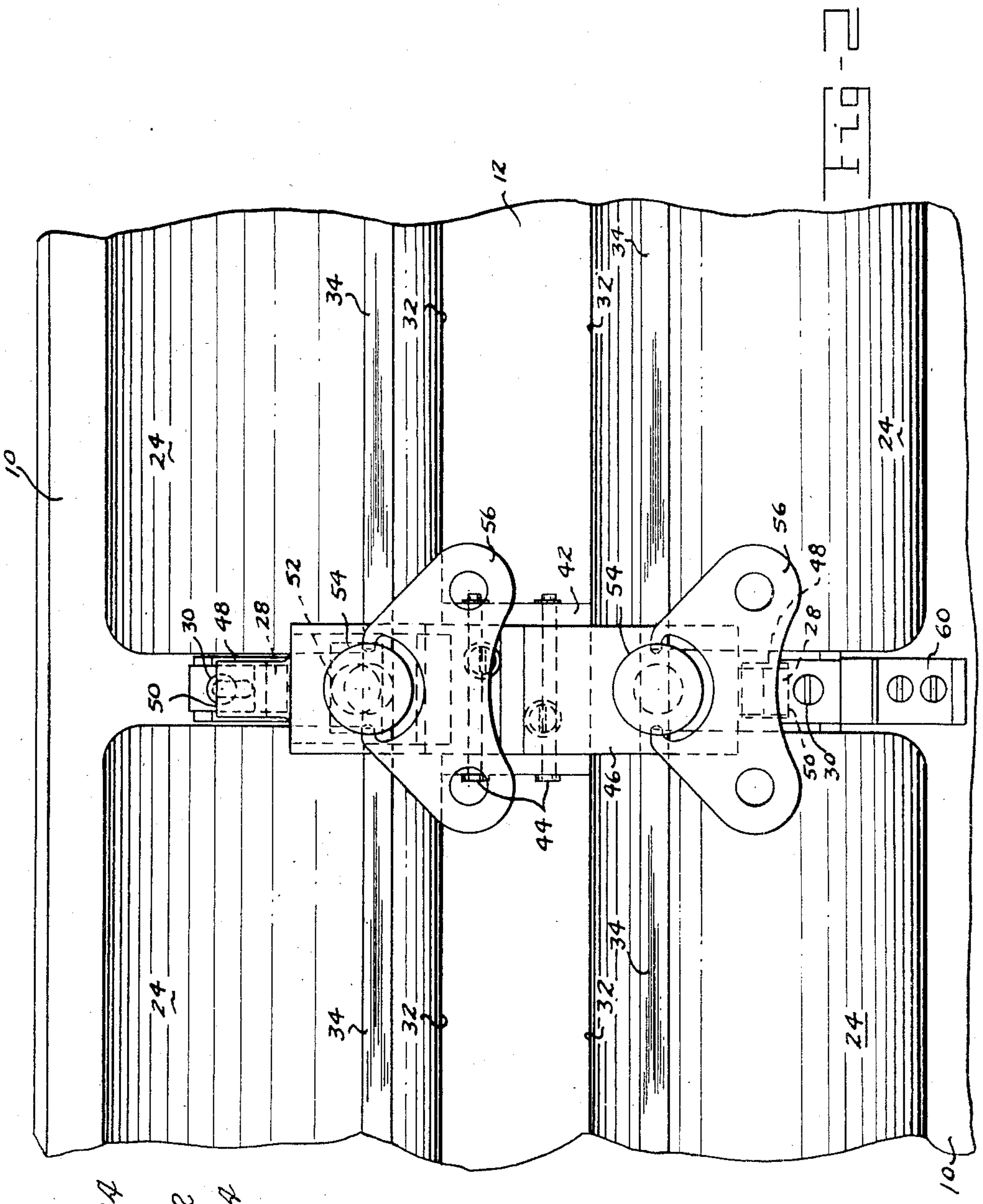
Fig. 2 is a front elevational view showing portions of four adjacent amplifier cans mounted on the heat exchanger unit of Fig. 1.
Figure 3:
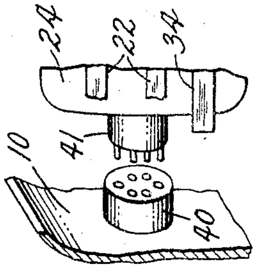
Fig. 3 is a view of the receptacle and plug conducting power to and from the amplifier cans.

Referring to the drawings and particularly to Fig. 1, there is illustrated a base plate 10 on which the entire unit is mounted. Perpendicularly mounted on the base plate 10 and extending outwardly therefrom is a cold plate 12 serving as the heat sink for the unit. The cold plate 12 is formed by the spaced upper and lower supporting plates 14 and 16, respectively, enclosing a plurality of perforated or interrupted fin type heat transfer elements 18 adapted to provide a large surface area exposed to the cooling air passing therethrough and to assure turbulent air flow by forcing the air to traverse the cold plate in a serpentine path. The heat transfer elements 18 are secured to the upper and lower plates 14 and 16, respectively, in such manner as to assure good heat transfer thereacross. Cooling air is introduced to and removed from the cold plate through base 10 by conventional means not shown in the drawings.

Mounted on the upper and lower plates 14 and 16 and at the end thereof disposed adjacent the base plate 10 are the pedestals 20 which serve as a pivotal support for the clamping bars 22. The clamping bars 22 are elongated members of a length sufficient to accommodate the unitized sealed assembly such as the amplifier cans 24. One end of the clamping bar 22 is pivotally mounted on the pedestal 20 as at 26, and the other end is provided with an extending hook member 28 secured thereto in any suitable manner such as by the screw 30.

The amplifier can 24 is provided with a flat bottom portion 32 adapted to be positioned adjacent the flat upper and lower surfaces of the cold plate 12 and in intimate contact therewith to facilitate heat transfer thereacross. The amplifier can 24 is also provided with an external flanged portion 34 having a raised ear 36 located approximately centrally of the length thereof and positioned for engagement with a matching ear 38 on the clamping bars 22. The electrical connections to the circuit components contained within the amplifier can 24 are readily effected through a receptacle 40 mounted on the base plate 10 and adapted to engage the plug 41.

Positioned on the end of the cold plate 12 remote from the base plate 10 is a pivotally mounted and manually actuated clamping assembly. The clamping assembly includes a pair of extending mounting plates 42 on which is pivotally mounted, as at 44, a slotted frame member 46. Displaceably contained within the slotted portion of the frame member 46 is a clamping member 48 having a hooked end 50 adapted to engage the extending hook member 28 mounted on the end of the clamping bar 22. Displacement of the clamping member 48 within the slotted frame member 46 is effected by an eccentric member 52 rotatably disposed in a suitably shaped aperture in said clamping member 48. The eccentric 52 is fixedly mounted on a shaft 54 which in turn is rotatably supported by the slotted frame member 46 and is provided with a suitable pivotally mounted wing type fixture 56 to permit ready manual rotation thereof.

As illustrated in Fig. 1, the upper and lower amplifier cans 24 are shown in assembled relation on the cold plate 12. In order to effect removal, the wing type fixture is manually turned to rotate the eccentric 52 and move the hooked end 50 of the displaceable clamping member 48 out of clamping engagement with the hook member 28 of the elongated clamping bar 22. After the hooked end 50 is disengaged from the hook member 28, the clamping assembly is pivotally rotated on its pivotal mounting 44. The outer end of the clamping bar 22 is raised by the pivotal displacement of said bar under the action of the spring 58. The pivotal displacement of the clamping bar 22 releases the securing pressure on the amplifier can 24 effected by the engagement of the ears 36 and 38 and the can may then be manually removed as a unit. Operation of the assembly for the lower unit is similar to that described above except that the spring 60 is there positioned to prevent the pivotal displacement of the clamping bar 22 under its own weight and the consequent possible dropping of the amplifier can 24.

The above described unit is one that provides an adequate heat transfer surface intermediate the amplifier cans 24 and the cold plate surfaces, and in addition thereto is such that permits ready removal or insertion of the unitized sealed assemblies.

Although the invention has been described in terms of specified apparatus which is set forth in considerable detail, it should be understood that this is by way of illustration only and that the invention is not necessarily limited thereto, since alternative embodiments and operating techniques will become apparent to those skilled in the art in view of the disclosure. Accordingly, modifications are contemplated which may be made without departing from the spirit of the described invention or of the scope of the appended claim.

What is claimed is:

A cooling system and mounting for unitized sealed electronic assemblies such as amplifier cans comprising a vertically-supported base plate; a cold plate supported by and extending horizontally from said base plate, said cold plate comprising an upper plate, a lower plate, a plurality of fin-type heat transfer elements positioned between and secured to said upper and lower plates to form the cold plate, said upper and lower plates having flat outer surfaces to fit closely to the flat surfaces of the bottoms of amplifier cans for conducting heat therefrom, plug units mounted on said base plate to provide electrical connections for a plurality of amplifier cans, a plurality of pedestals mounted on the upper and lower plates near said base plate, said pedestals being spaced to allow amplifier cans to be positioned between adjacent pedestals on the upper and lower plates, clamping bars pivotally mounted on said pedestals and designed to hold adjacent amplifier cans in position on the cold plate by contact with a flanged edge of each can, a plurality of separable fastening means pivotably attached to the outer edge of said cold plate and designed to engage the free-ends of the clamping bars to lock the bars in place holding amplifier cans on the cold plate, a plurality of spring means attached to said upper plate acting to urge said clamping bars from contact with the amplifier cans facilitating removal of the amplifier cans, and a plurality of other spring means attached to said base plate to prevent amplifier cans positioned on said lower plate from falling under their own weight from the mounting upon release of the fastening means.

References Cited in the file of this patent

UNITED STATES PATENTS

| | | |
|---|---|---|
| 2,045,659 | Lindenblad | June 30, 1936 |
| 2,247,199 | Kritzer | June 24, 1941 |
| 2,692,961 | Fondiller | Oct. 26, 1954 |
| 2,819,330 | White | Jan. 7, 1958 |